United States Patent
Asada

(10) Patent No.: US 9,678,444 B2
(45) Date of Patent: Jun. 13, 2017

(54) OPTICAL APPARATUS, PROJECTION OPTICAL SYSTEM, EXPOSURE APPARATUS, AND METHOD OF MANUFACTURING ARTICLE

(71) Applicant: CANON KABUSHIKI KAISHA, Tokyo (JP)

(72) Inventor: Katsumi Asada, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 16 days.

(21) Appl. No.: 14/699,365

(22) Filed: Apr. 29, 2015

(65) Prior Publication Data

US 2015/0316852 A1 Nov. 5, 2015

(30) Foreign Application Priority Data

May 2, 2014 (JP) ................. 2014-095510

(51) Int. Cl.
*G03B 27/54* (2006.01)
*G03F 7/20* (2006.01)
(Continued)

(52) U.S. Cl.
CPC ......... *G03F 7/709* (2013.01); *G02B 26/0825* (2013.01); *G02B 26/0858* (2013.01);
(Continued)

(58) Field of Classification Search
CPC G02B 26/08; G02B 26/0825; G02B 26/0858; G02B 27/00; G02B 27/0068;
(Continued)

(56) References Cited

U.S. PATENT DOCUMENTS 5,142,132 A 8/1992 MacDonald et al.
6,840,638 B2 1/2005 Watson
(Continued)

FOREIGN PATENT DOCUMENTS

CN 101122679 A 2/2008
CN 101226274 A 7/2008
(Continued)

OTHER PUBLICATIONS

Office Action issued in Taiwanese Appln. No. 104112396 mailed Aug. 24, 2016. English translation provided.
(Continued)

*Primary Examiner* — Peter B Kim
(74) *Attorney, Agent, or Firm* — Rossi, Kimms & McDowell LLP

(57) ABSTRACT

The present invention provides an optical apparatus that deforms a reflecting surface of a mirror, comprising a base plate, a plurality of actuators that are disposed between the base plate and the mirror and are configured to apply a force to the mirror, a detection unit configured to detect vibration generated in the base plate, and a control unit configured to control each actuator based on a result of detection performed by the detection unit such that a deformation of the mirror caused as a result of the vibration generated in the base plate is within an acceptable range.

34 Claims, 9 Drawing Sheets

(51) Int. Cl.
  *G02B 26/08* (2006.01)
  *G02B 27/00* (2006.01)
(52) U.S. Cl.
  CPC ......... *G02B 27/0068* (2013.01); *G03F 7/706* (2013.01); *G03F 7/70266* (2013.01); *G03F 7/70308* (2013.01)
(58) Field of Classification Search
  CPC .. G03F 7/70266; G03F 7/70308; G03F 7/706; G03F 7/709
  USPC .......................................................... 355/67
  See application file for complete search history.

(56) References Cited

U.S. PATENT DOCUMENTS

| | | | |
|---|---|---|---|
| 6,842,277 | B2 | 1/2005 | Watson |
| 9,081,292 | B2 | 7/2015 | Hauf et al. |
| 2008/0291559 | A1 | 11/2008 | Tanaka et al. |
| 2010/0027143 | A1* | 2/2010 | Angel ................ G02B 26/0825 359/847 |
| 2013/0093905 | A1 | 4/2013 | Saitsu |
| 2014/0285783 | A1 | 9/2014 | Dinger et al. |

FOREIGN PATENT DOCUMENTS

| | | |
|---|---|---|
| CN | 101504487 A | 8/2009 |
| CN | 101923214 A | 12/2010 |
| CN | 103502891 A | 1/2014 |
| JP | 2004064076 A | 2/2004 |
| JP | 2005004146 A | 1/2005 |
| TW | 201305601 A1 | 2/2013 |

OTHER PUBLICATIONS

Office Action issued in Chinese Patent Application No. 201510216833.6 mailed Mar. 13, 2017. English translation provided.

* cited by examiner

OPTICAL APPARATUS, PROJECTION OPTICAL SYSTEM, EXPOSURE APPARATUS, AND METHOD OF MANUFACTURING ARTICLE

BACKGROUND OF THE INVENTION

Field of the Invention

The present invention relates to an optical apparatus that deforms the reflecting surface of a mirror, a projection optical system including the optical apparatus, an exposure apparatus, and a method of manufacturing an article.

Description of the Related Art

In order to improve the resolution of an exposure apparatus for use in manufacturing semiconductor devices, there is a need to correct the optical aberration of a projection optical system included in the exposure apparatus. Japanese Patent Laid-Open No. 2004-64076 proposes an optical apparatus that corrects the optical aberration of a projection optical system by applying a force to a mirror included in the projection optical system by a plurality of actuators so as to deform the reflecting surface of the mirror.

In an exposure apparatus, if vibrations of the floor on which the exposure apparatus is disposed, vibrations generated within the exposure apparatus, and the like are transmitted to the mirror as disturbance, the mirror may be deformed due to the vibrations. The optical apparatus disclosed in Japanese Patent Laid-Open No. 2004-64076 corrects such an unintended deformation of the mirror caused by vibrations by controlling each actuator based on the error between the mirror shape measured by a sensor and the target shape. With such control, however, each actuator is controlled based on the result of measurement of the shape of the mirror deformed by the vibrations transmitted to the mirror, which makes it more difficult to cause the control of each actuator to follow vibrations as the frequency of the vibrations increases. In other words, an unintended deformation of the mirror caused by vibrations having a high-frequency component may not be sufficiently corrected.

SUMMARY OF THE INVENTION

The present invention provides an optical apparatus that is advantageous in, for example, correcting an unintended deformation of a mirror caused by vibrations.

According to one aspect of the present invention, there is provided an optical apparatus that deforms a reflecting surface of a mirror, the optical apparatus comprising: a base plate; a plurality of actuators that are disposed between the base plate and the mirror and are configured to apply a force to the mirror; a detection unit configured to detect vibration generated in the base plate; and a control unit configured to control each actuator based on a result of detection performed by the detection unit such that a deformation of the mirror caused as a result of the vibration generated in the base plate is within an acceptable range.

Further features of the present invention will become apparent from the following description of exemplary embodiments with reference to the attached drawings.

DESCRIPTION OF THE EMBODIMENTS

Figure 1:
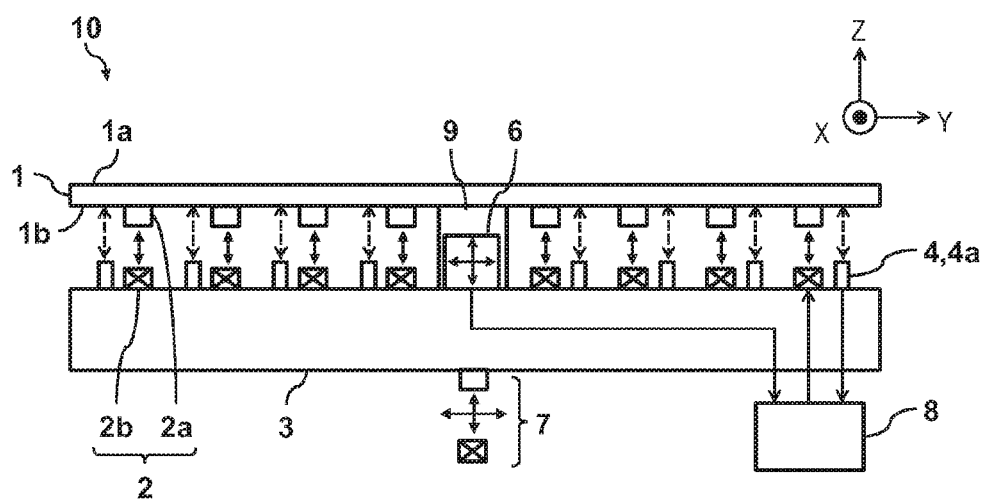
FIG. 1 is a schematic diagram showing an example of a configuration of an optical apparatus according to a first embodiment

Exemplary embodiments of the present invention will be described below with reference to the accompanying drawings. Note that the same reference numerals denote the same members throughout the drawings, and a repetitive description thereof will not be given.

First Embodiment

Apparatus Configuration

An optical apparatus 10 according to a first embodiment will be described with reference to FIG. 1. FIG. 1 is a schematic diagram showing an example of a configuration of the optical apparatus 10 according to the first embodiment. The optical apparatus 10 according to the first embodiment corrects the optical aberration of a projection optical system as well as the magnification, distortion and focus of the projected image by, for example, deforming a reflecting surface 1a of a mirror 1 included in the projection optical system included in an exposure apparatus. The optical apparatus 10 may include the mirror 1, a base plate 3, a plurality of actuators 2, a measuring unit 4, and a control unit 8. The control unit 8 includes a CPU, a memory and the like, and controls the plurality of actuators 2.

The mirror 1 includes the reflecting surface 1a that reflects light and a back surface 1b that is opposite the reflecting surface, and an area (hereinafter referred to as the "central area") of the mirror 1 including the center of the mirror 1 is fixed to the base plate 3 via a fixing member 9. The reason that the central area of the mirror 1 is fixed to the base plate 3 as described above is that, with the mirror 1 used in a projection optical system of an exposure apparatus, it is often the case that light is not applied to the central area of the mirror 1, and thus the need for deforming the central area of the mirror 1 is small. In the first embodiment, the central area of the mirror 1 is fixed to the base plate 3 via the fixing member 9, but any area of the mirror 1 may be fixed to the base plate 3 via the fixing member 9. As the actuators 2, displacement actuators such as piezoelectric elements are used, and in the case where the mirror 1 is supported on the base plate 3 by the actuators 2, the fixing member 9 may be omitted. Also, in the first embodiment, an example will be described in which a circular plane mirror is used as the mirror 1, but the mirror 1 is not limited thereto, and it is possible to use, for example, a spherical mirror having a concave surface or a convex surface as the mirror 1.

The plurality of actuators 2 are disposed between the mirror 1 and the base plate 3, and applies a force to the mirror 1 (the back surface 1b). The actuators 2 may be non-contact actuators each including a movable element 2a and a stator 2b that do not come into contact with each other such as, for example, voice coil motors (VCM) or linear motors, but it is also possible to use, for example, displacement actuators such as piezoelectric elements. In the case where non-contact actuators such as VCMs are used as the actuators 2, either one of the movable element 2a and the stator 2b of each actuator 2 is fixed to the back surface 1b of the mirror 1, and the other one is fixed to the base plate 3. In the example shown in FIG. 1, the movable elements 2a are fixed to the base plate 3, and the stators 2b are fixed to the back surface 1b of the mirror 1. With this configuration, the actuators 2 can change the distance between the mirror 1 and the base plate 3 by applying a force to the back surface 1b of the mirror 1.

The measuring unit 4 measures the position at each of a plurality of locations in the mirror 1 so as to obtain the shape of the mirror 1. The measuring unit 4 may include a plurality of displacement meters 4a, such as capacitive sensors, that measure a displacement (for example, a displacement in the Z direction) from one reference position in the mirror 1. The measuring unit 4 can determine the shape of the mirror 1 by measuring the positions at locations in the mirror 1 with the use of the displacement meters 4a. Alternatively, the measuring unit 4 may include a measuring instrument, such as a laser interferometer or a Schack-Hartmann sensor, which measures the shape of the reflecting surface 1a of the mirror 1. In this case, the measuring unit 4 can determine the positions at locations in the mirror 1 based on the shape of the reflecting surface 1a of the mirror 1 measured by the measuring instrument.

Figure 2:
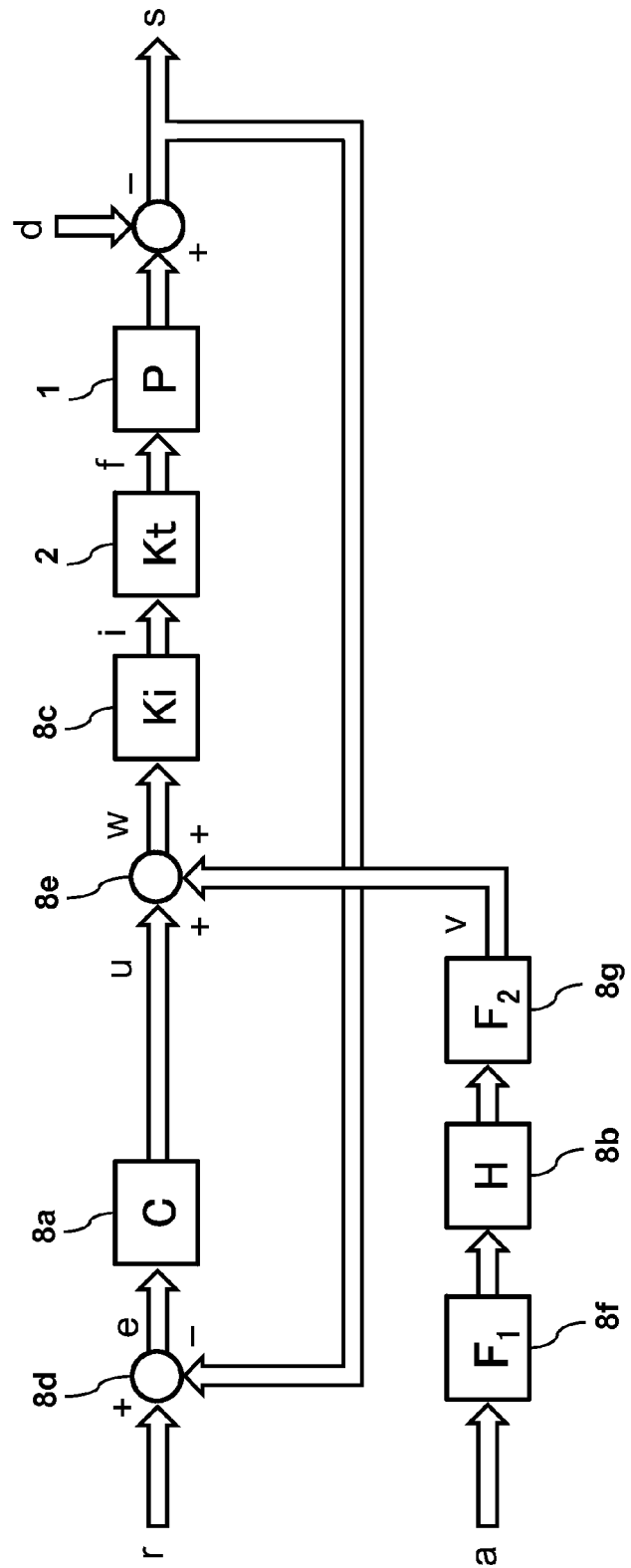
FIG. 2 is a block diagram of a control system in the optical apparatus according to the first embodiment.

The optical apparatus 10 configured as described above feed-back controls each actuator 2 based on the error between the shape of the mirror 1 measured by the measuring unit 4 and the target shape. For example, the control unit 8 of the optical apparatus 10 determines a command value for driving each actuator 2 such that the error between the position at a location in the mirror 1 measured by the measuring unit 4 and the target position of that location approaches zero, and controls the actuator 2 based on the command value. By doing so, each actuator 2 applies a force to the mirror 1 so as to deform the mirror 1, and it is thereby possible to bring the shape of the mirror 1 closer to the target shape. A control system in the optical apparatus 10 will now be described. FIG. 2 is a block diagram of the control system in the optical apparatus 10 according to the first embodiment. In the block diagram shown in FIG. 2, it is assumed that compensators 8a and 8b, a driver 8c, a subtracter 8d, an adder 8e, and filters 8f and 8g are included in the control unit 8. Also, in the following description, the force applied to the mirror 1 by the actuators 2 will be referred to as the "driving force". Also, the shape s of the mirror 1 may be represented by a matrix of the positions at locations in the mirror 1, and target shape r may be represented by a matrix of the target positions at the locations in the mirror 1.

In the control system of the optical apparatus 10, the shape s (current shape) of the mirror 1 measured by the measuring unit 4 is supplied to the subtracter 8d. The subtracter 8d calculates an error e between the shape s of the mirror 1 and the target shape r, and supplies a signal indicating the error e to the compensator 8a (second compensator). The compensator 8a is, for example, a PID compensator having a transfer function C. The compensator 8a determines a command value u (second command value) for controlling each actuator 2 based on the error e supplied (input) from the subtracter 8d, and outputs the command value u. The command value u is combined with a command value v determined by the compensator 8b, which will be described later, by the adder 8e, and then supplied to the driver 8c as a command value w. The driver 8c is a current driver that supplies current for driving each actuator 2 to the actuator 2, and has a current gain Ki. Each actuator 2 has a thrust constant Kt, and as a result of a current i being supplied from the driver 8c, the actuator 2 applies a driving force f to the mirror 1. Generally, the driver 8c and each actuator 2 can respond up to a high frequency band of over several kHz, and the command value w and the driving force f have a proportional relationship. The mirror 1 has a transfer function P that receives an input of the driving force f applied by each actuator 2 and outputs the shape s of the mirror 1. In this way, by feed-back controlling each actuator 2 based on the error e between the shape s of the mirror 1 measured by the measuring unit 4 and the target shape r, the shape s of the mirror 1 can be brought closer to the target shape r.

In an exposure apparatus, situations may occur in which vibrations of the floor on which the exposure apparatus is disposed, vibrations generated within the exposure apparatus by driving a stage holding a mask, and the like are transmitted to the mirror 1 via the base plate 3 as disturbance d. If vibrations are transmitted to the mirror 1 in this way, the mirror 1 is deformed by the vibrations, and the optical aberration of the projection optical system may not be sufficiently corrected. As described above, the optical apparatus 10 can correct such an unintended deformation of the mirror 1 caused by vibrations by feed-back controlling each actuator 2 based on the error between the shape s of the mirror 1 and the target shape r. However, with such feed-back control, each actuator 2 is controlled based on the result of measurement of the shape s of the mirror 1 deformed by the vibrations (disturbance d) transmitted to the mirror 1. For this reason, it may become difficult to cause the control of each actuator 2 to follow the vibrations as the frequency of the vibration increases. In other words, with the feed-back control based on the shape s of the mirror 1, an unintended deformation of the mirror 1 caused by vibrations having a high-frequency component may not be sufficiently corrected. In addition, if the feed-back gain is increased so as to further reduce the error e, the mirror may become vibratory due to the influence of many elastic deformation modes, and in turn, the error e may become large. To address this, in the optical apparatus 10 according to the first embodiment, a detection unit 6 that detects vibration of the base plate 3 is included in the base plate 3. Then, the optical apparatus 10 feed-forward controls each actuator 2 based on the result of detection performed by the detection unit 6 such that the deformation (the amount of deformation) of the mirror 1 caused as a result of vibration generated in the base plate 3 is within an acceptable range. Hereinafter, a description will be given of the detection unit 6 provided in the optical apparatus 10 according to the first embodiment and the feed-forward control of each actuator 2 based on the result of detection performed by the detection unit 6.

As shown in FIG. 1, the detection unit 6 is provided to the base plate 3, and detects vibration generated in the base plate 3. The detection unit 6 may include, for example, an accelerometer, and detect acceleration of the base plate 3 as the vibration generated in the base plate 3. The detection unit 6 may be configured to detect the acceleration of the base plate 3 in a direction in which an unintended deformation of the mirror 1 is likely to occur (for example, the Z direction), but may be configured to detect acceleration in the X direction and the Y direction. Alternatively, the detection unit 6 may include a velocimeter instead of the accelerometer, and detect the velocity of the base plate 3. In this case, the detection unit 6 can determine the acceleration of the base plate 3 by performing a differential operation on the velocity of the base plate 3 detected by the velocimeter.

As shown in FIG. 2, acceleration a of the base plate 3 detected by the detection unit 6 is supplied, via the filter 8f (high-pass filter) having a transfer function $F_1$ that attenuates a low-frequency component, to the compensator 8b (first compensator). The compensator 8b is, for example, a PID compensator having a transfer function H, and a proportional, integral or derivative configuration or a combination thereof. The compensator 8b determines (outputs) the command value v for controlling each actuator 2 based on the acceleration a supplied via the filter 8f such that the deformation (the amount of deformation) of the mirror 1 caused by the vibration of the base plate 3 is within an acceptable range. The determined command value v is supplied to the adder 8e via the filter 8g. The filter 8g may include, for example, a low-pass filter having a transfer function $F_2$ that attenuates a high-frequency component. Generally, on the high-frequency side, it may become difficult to control each actuator 2 due to the influence of noise and a limit of the sampling frequency. Accordingly, in the optical apparatus 10 according to the first embodiment, the filter 8g is used so that feed-forward control is performed in an appropriate frequency band (for example, a frequency band actually used in the apparatus). The transfer function $F_2$ of the filter 8g may have, in addition to the low-pass characteristics that attenuate a high-frequency component, notch characteristics that attenuate a predetermined frequency component, or may have phase compensation characteristics if the frequency characteristics of the driver 8c have a phase delay in that frequency band. In the first embodiment, an example is described in which the filters 8f and 8g are used, but the filters 8f and 8g are not necessarily required.

Method of Determining Transfer Function H of Compensator 8b

A method of determining the transfer function H of the compensator 8b will be described. As shown in Equation (1), the transfer function H of the compensator 8b can be determined by multiplying an inverse of a transfer function U (first transfer function) by a transfer function G (second transfer function). The transfer function U is a transfer function that receives an input of the command value v (or the driving force f that is proportional to the command value v) and outputs deformation of the mirror 1. The command value v includes a plurality of command values for controlling the plurality of actuators, and the deformation of the mirror 1 may include displacements of a plurality of locations in the mirror 1. Accordingly, the transfer function U can be represented by a matrix of the command value v for controlling each actuator 2 and the displacement at locations in the mirror 1. In this case, "$U^{-1}$" in Equation (1) is an inverse matrix of the transfer function U. The transfer function G is a transfer function that receives an input of vibration of the base plate 3 and outputs deformation of the mirror 1. The vibration of the base plate 3 may include, for example, a plurality of (three) direction components such as the Z direction, the X direction and the Y direction. Accordingly, the transfer function G can be represented by a matrix of each direction component in the vibration of the base plate 3 and the displacement at locations in the mirror 1. Here, if the number of inputs and the number of outputs in each transfer function are different, the transfer function H of the compensator 8b can be determined by Equation (2) in which a pseudo-inverse matrix is used instead of the inverse matrix. In Equation (2), T indicates transpose. Also, in the first embodiment, a method in which the control unit 8 determines the transfer function H of the compensator 8b will be described, but the present invention is not limited thereto. The transfer function H of the compensator 8b may be determined by, for example, determining the transfer function U and the transfer function G through calculation or simulation using an external computer provided outside the optical apparatus 10 or the exposure apparatus.

$$H = U^{-1} \cdot G \tag{1}$$

$$H = (U^T \cdot U)^{-1} \cdot U^T \cdot G \tag{2}$$

Hereinafter, a method of determining the transfer function U and the transfer function G will be described. First, a method of determining the transfer function U (first transfer function) will be described. The transfer function U can be obtained by a vibration experiment in which the amplitude ratio and the phase difference between the driving force or command value of the actuator and the displacement of the mirror 1 are checked while the actuator 2 is driven over a wide frequency range. To be more specific, the control unit 8 determines the command value v such that one of the plurality of actuators 2 applies a unit amount of force (driving force) to the mirror 1 over a wide frequency, and controls the single actuator 2 based on the determined command value v. At this time, the control unit 8 causes the measuring unit 4 to measure displacement of each location in the mirror 1 when only one actuator 2 applies a unit amount of force to the mirror 1, and obtains the result of measurement.

Figure 3A:
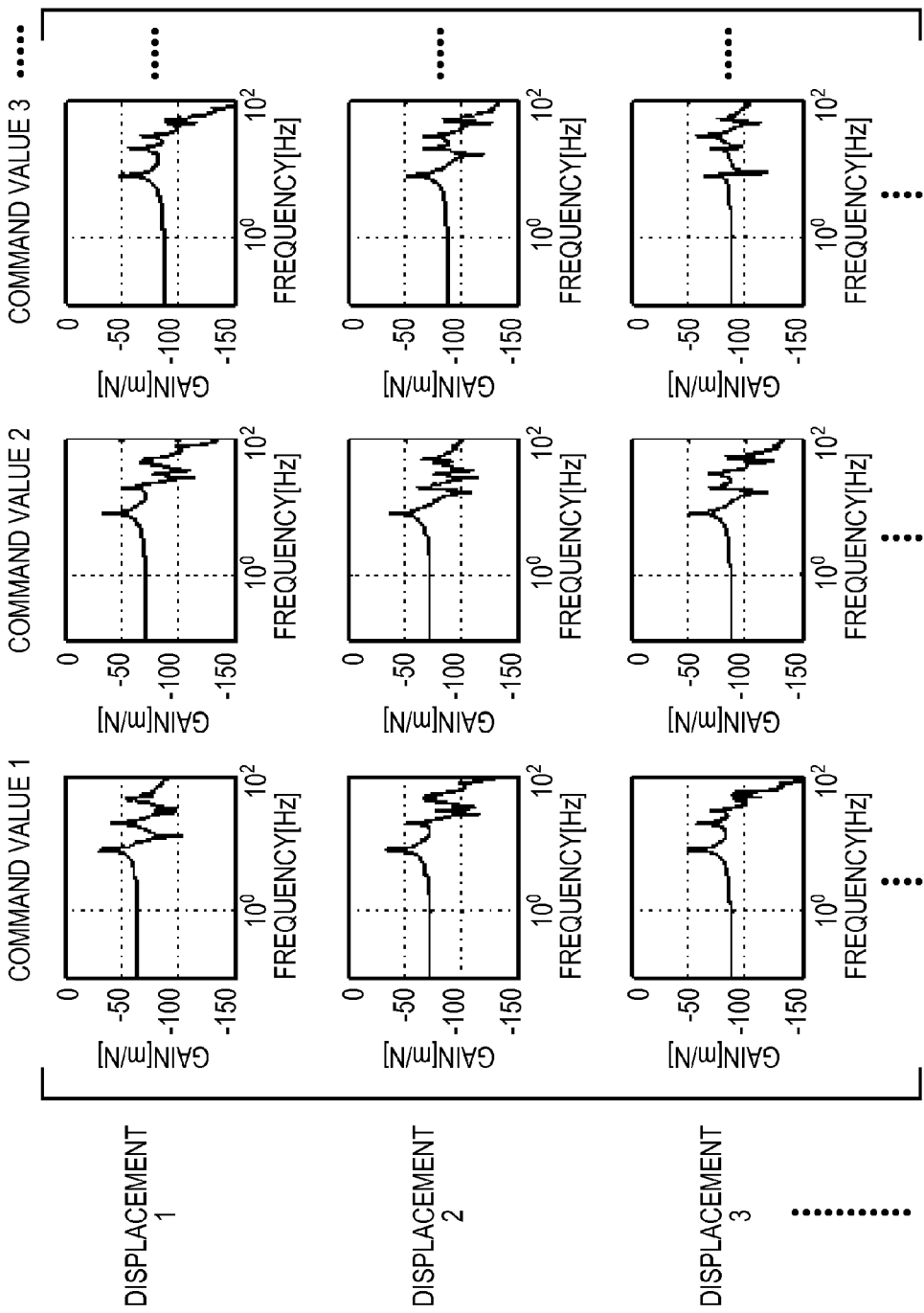
FIG. 3A is a diagram showing a transfer function in the control system according to the first embodiment.

The control unit 8 performs a step of controlling one actuator 2 so as to obtain displacement of each location in the mirror 1, sequentially for each actuator 2. By doing so, as shown in FIG. 3A, the control unit 8 can determine the transfer function U represented by a matrix of the command values v (command value 1, command value 2 . . . ) for controlling each actuator 2 and displacement (displacement 1, displacement 2 . . . ) of each location in the mirror 1. In the determined transfer function U, many elastic deformation modes of the mirror 1 appear in each element of the matrix, and the characteristics may be slightly different from each other.

Figure 3B:
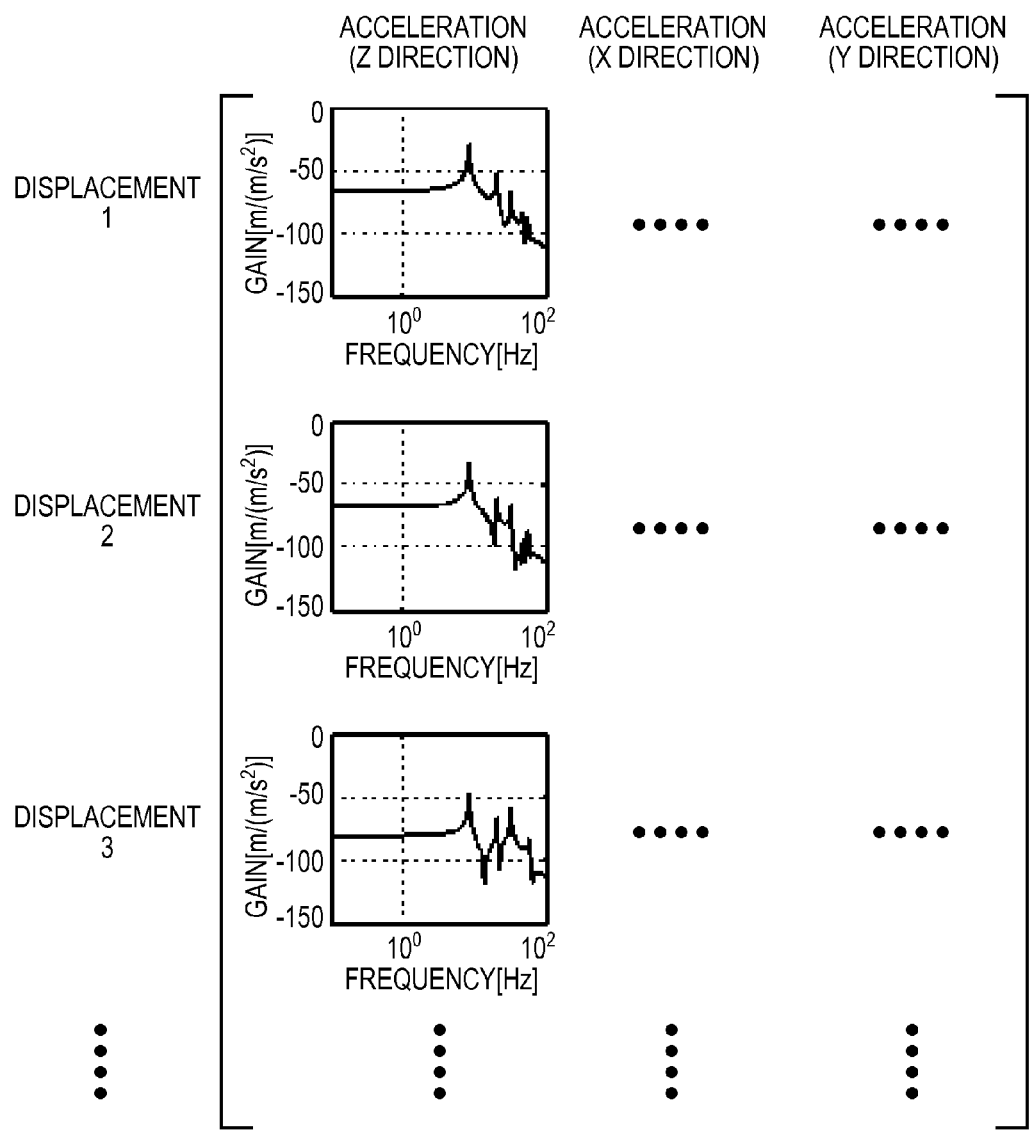
FIG. 3B is a diagram showing a transfer function in the control system according to the first embodiment.

Next, a method of determining the transfer function G (second transfer function) will be described. The transfer function G can be obtained by a vibration experiment in which the amplitude ratio and the phase difference between the vibration of the base plate 3 and the displacement of the mirror 1 are checked while vibration is applied to the base plate 3 over a wide frequency range. In order to perform such a vibration experiment, the optical apparatus 10 according to the first embodiment may include a vibration unit 7 that applies vibration (acceleration) to the base plate 3. The vibration unit 7 may be configured to apply vibration to the base plate 3 in a plurality of (three) directions including the Z direction, the X direction and the Y direction. The control unit 8 causes the measuring unit 4 to measure, in each direction, the amounts of displacement at locations in the mirror 1 when the acceleration a is applied to the base plate 3 by the vibration unit 7, and obtains the result of measurement. By doing so, as shown in FIG. 3B, the control unit 8 can determine the transfer function G represented by a matrix of the acceleration a in each direction (Z direction, X direction or Y direction) applied to the base plate 3 and displacement (displacement 1, displacement 2 . . . ) of each location in the mirror 1. In the determined transfer function G, many elastic deformation modes of the mirror 1 appear in each element of the matrix, and the characteristics may be slightly different from each other.

Figure 3C:
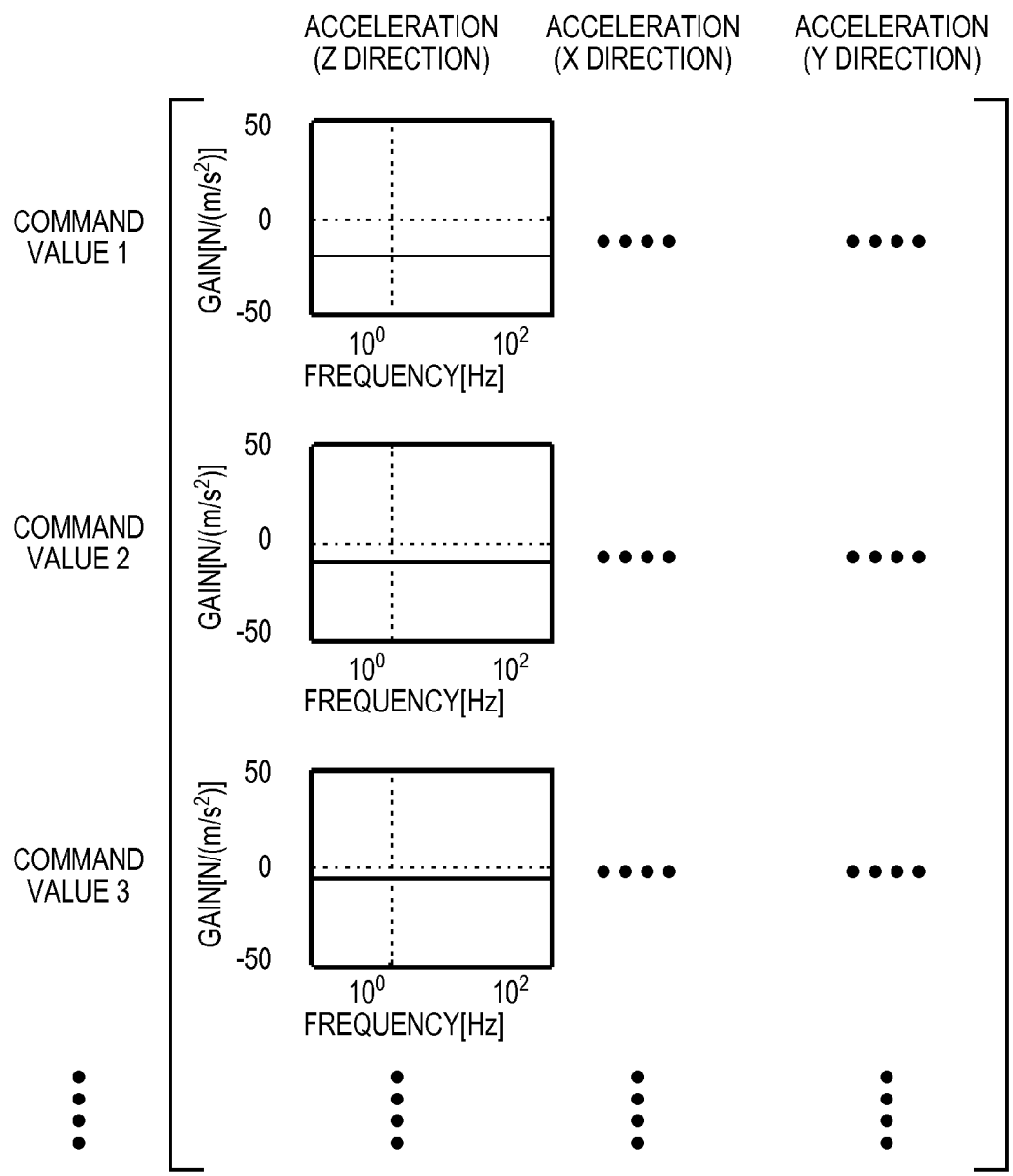
FIG. 3C is a diagram showing a transfer function in the control system according to the first embodiment.

The control unit 8 determines the transfer function H of the compensator 8*b* by using Equation (1) or Equation (2). FIG. 3C is a diagram showing the transfer function H of the compensator 8*b* represented by a matrix of the acceleration a in each direction (Z direction, X direction or Y direction) applied to the base plate 3 and the command value v (command value 1, command value 2 . . . ) for controlling each actuator 2. In each element of the transfer function H, a large number of elastic deformation modes are canceled out by the operation of Equation (1) or Equation (2) and flat gain characteristics that do not depend on the frequency are obtained. That is, the transfer function H can be represented by a matrix of coefficient that does not depend on the frequency. The coefficient means a physical mass in a unit dimension after the operation using Equation (1) or Equation (2), and thus can be interpreted as a distributed mass driven by each actuator 2. Accordingly, in the case of driving the mirror 1 (deformable mirror) having a feature of an elastic body, the control unit 8 can control the actuators 2 simultaneously via the compensator 8*b* having the transfer function H obtained by the above-described method. By doing so, it is possible to suppress the occurrence of unintended displacement in the mirror 1 due to the vibration of the base plate 3. Here, as described above, the transfer function H of the compensator 8*b* may be determined by the transfer function U and the transfer function G by performing analysis with a finite element model by using an external computer provided outside the optical apparatus 10 or the exposure apparatus. In this case, there may be an error between the transfer function H obtained by analysis and the transfer function H obtained by actual measurement, and thus the transfer function H obtained by analysis may be partially corrected by comparing the transfer function H obtained by analysis and the transfer function H obtained by actual measurement.

Benefit of Feed-Forward Control

Figure 4:
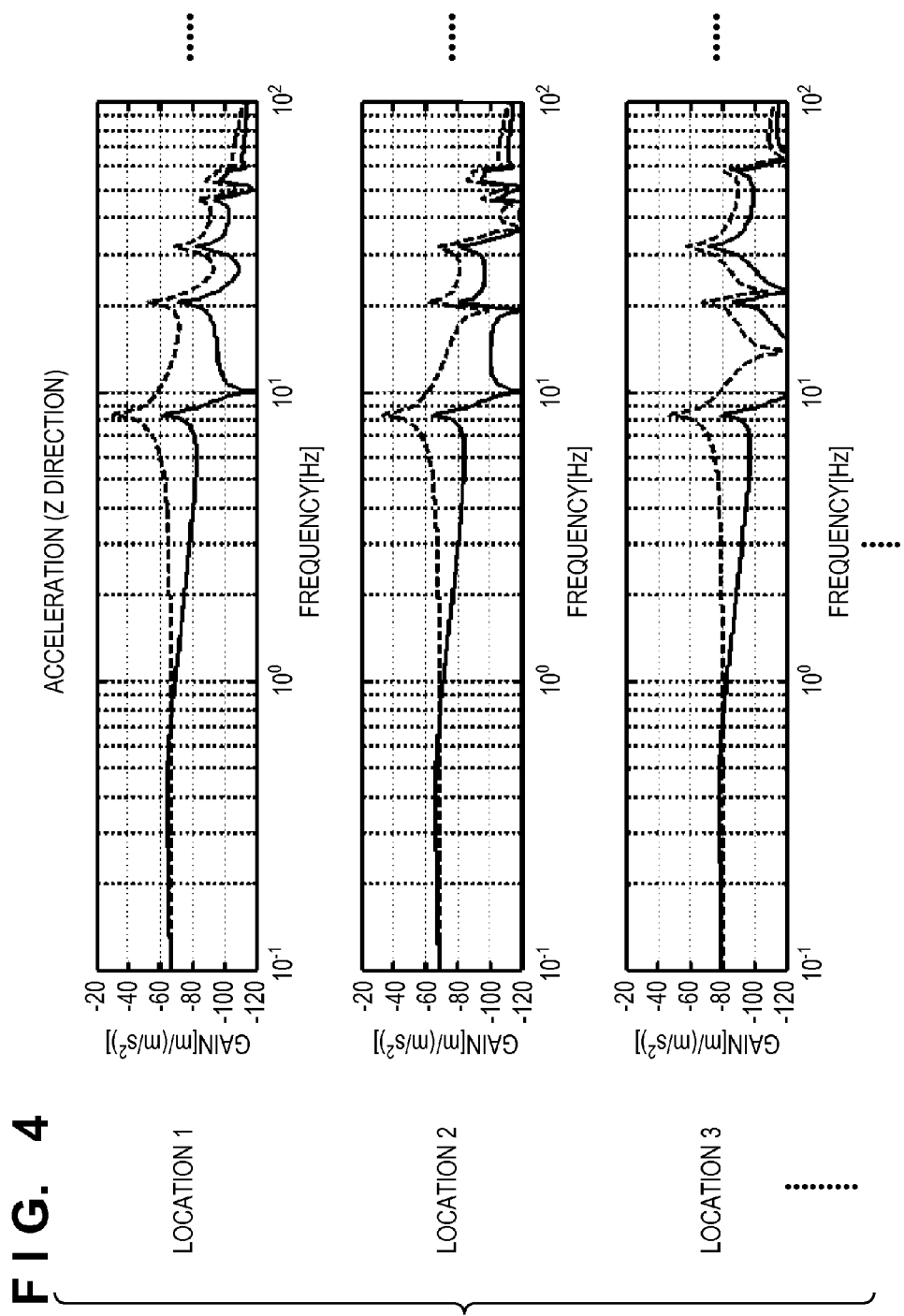
FIG. 4 is a diagram showing transfer functions involved in transmission of vibration of a base plate to locations in a mirror.

FIG. 4 is a diagram showing transfer functions involved in transmission of vibration (acceleration a) in the Z direction of the base plate 3 to locations (location 1, location 2 . . . ) in the mirror 1 in the optical apparatus 10 according to the first embodiment. In FIG. 4, the solid line indicates the case where the feed-forward control system is operated, and the broken line indicates the case where the feed-forward control system is not operated. Also, a high-pass filter having a cutoff frequency of 1 Hz is used as the filter 8*f*, and a low-pass filter having a cutoff frequency of 200 Hz is used as the filter 8*g*. As shown in FIG. 4, in the case where the feed-forward control system is operated, the vibration transmitted from the base plate 3 to locations on the mirror 1 is reduced by 20 to 40 dB in a frequency range of 1 to 100 Hz, as compared to the case where the feed-forward control system is not operated. That is, with the optical apparatus 10 according to the first embodiment, by feed-forward controlling each actuator 2 based on the vibration of the base plate 3, an unintended deformation of the mirror 1 caused by the vibration of the base plate 3 can be reduced.

As described above, the optical apparatus 10 according to the first embodiment includes the detection unit 6 that detects the vibration of the base plate 3. Then, the optical apparatus 10 feed-forward controls each actuator 2 configured to apply a force to the mirror 1 based on the result of detection performed by the detection unit 6 such that the amount of displacement of the mirror 1 caused as a result of vibration being generated in the base plate 3 is within an acceptable range. By doing so, the optical apparatus 10 can accurately correct the unintended deformation of the mirror 1 caused by vibration having a high-frequency component.

Second Embodiment

Figure 5:
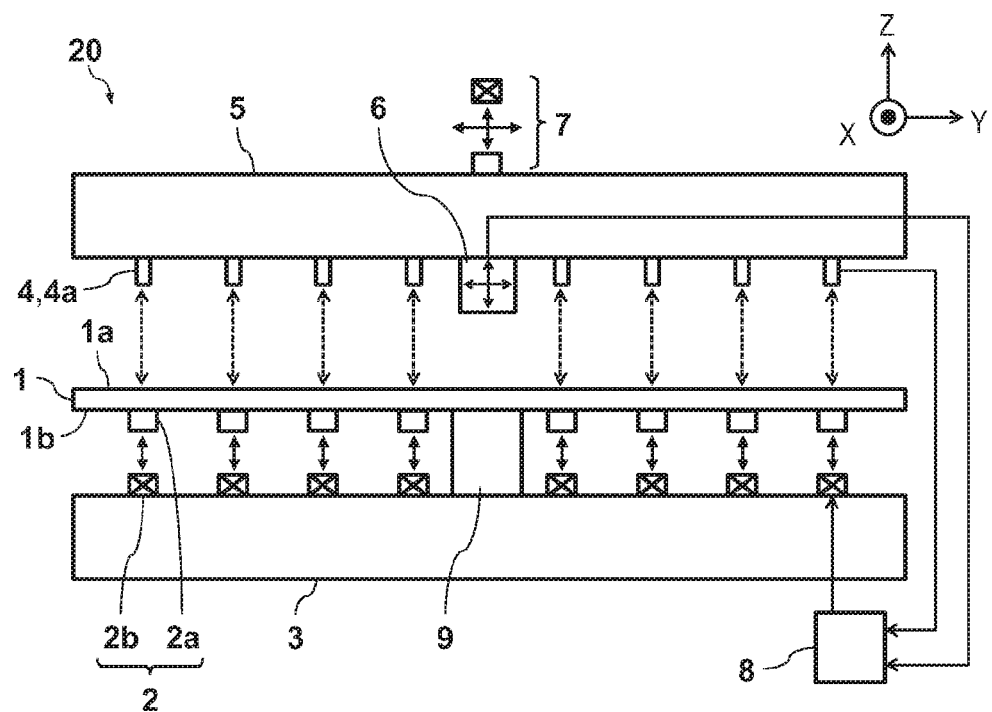
FIG. 5 is a schematic diagram showing an example of a configuration of an optical apparatus according to a second embodiment.

An optical apparatus 20 according to a second embodiment of the present invention will be described with reference to FIG. 5. FIG. 5 is a cross-sectional view showing the optical apparatus 20 according to the second embodiment. The optical apparatus 20 according to the second embodiment includes a reference object 5 provided separately from the base plate 3, and the reference object 5 is provided with a detection unit 6 and a measuring unit 4. The detection unit 6 provided to the reference object 5 detects the acceleration of the reference object 5 as the vibration generated in the base plate 3, and the measuring unit 4 measures the positions at locations in the mirror 1. The reference object 5 may have an opening so that the light that is incident on the mirror 1 and the light reflected by the mirror 1 can pass therethrough. A control system in the optical apparatus 20 of the second embodiment has the same configuration as the control system of the optical apparatus according to the first embodiment, and thus a description of the configuration of the control system is omitted here.

The reference object 5 may be supported by a structural body (for example, a casing) that supports the base plate 3, but the present invention is not limited thereto, and the reference object 5 may be supported by a structural body that is different from the structural body supporting the base plate 3. In the case where the reference object 5 and the base plate 3 are supported by the same structural body, as shown in FIG. 5, a vibration unit 7 may be provided to the reference object 5. In this case, in the step of obtaining the transfer function G, if the reference object 5 is vibrated by the vibration unit 7 provided to the reference object 5, the position of the reference object 5 varies, which is measured as the displacement of the mirror 1 by the displacement meters 4*a* that measure displacement with respect to the reference object 5. The transfer function G may be obtained by using the measured values.

Third Embodiment

An optical apparatus according to a third embodiment will be described. The optical apparatus according to the third embodiment is different from the optical apparatus 10 according to the first embodiment in that the control system for controlling each actuator 2 such that the shape of the mirror 1 is brought closer to the target shape has a different configuration. In the optical apparatus 10 according to the first embodiment, each actuator 2 is feed-back controlled based on the error between the shape of the mirror 1 the target shape, but in the optical apparatus according to the third embodiment, each actuator 2 is feed-forward controlled based on target shape r' of the mirror 1. The optical apparatus according to the third embodiment has the same configuration as the optical apparatus 10 according to the first embodiment or the optical apparatus 20 according to the second embodiment, and thus a description of the apparatus configuration is omitted here.

Figure 6:
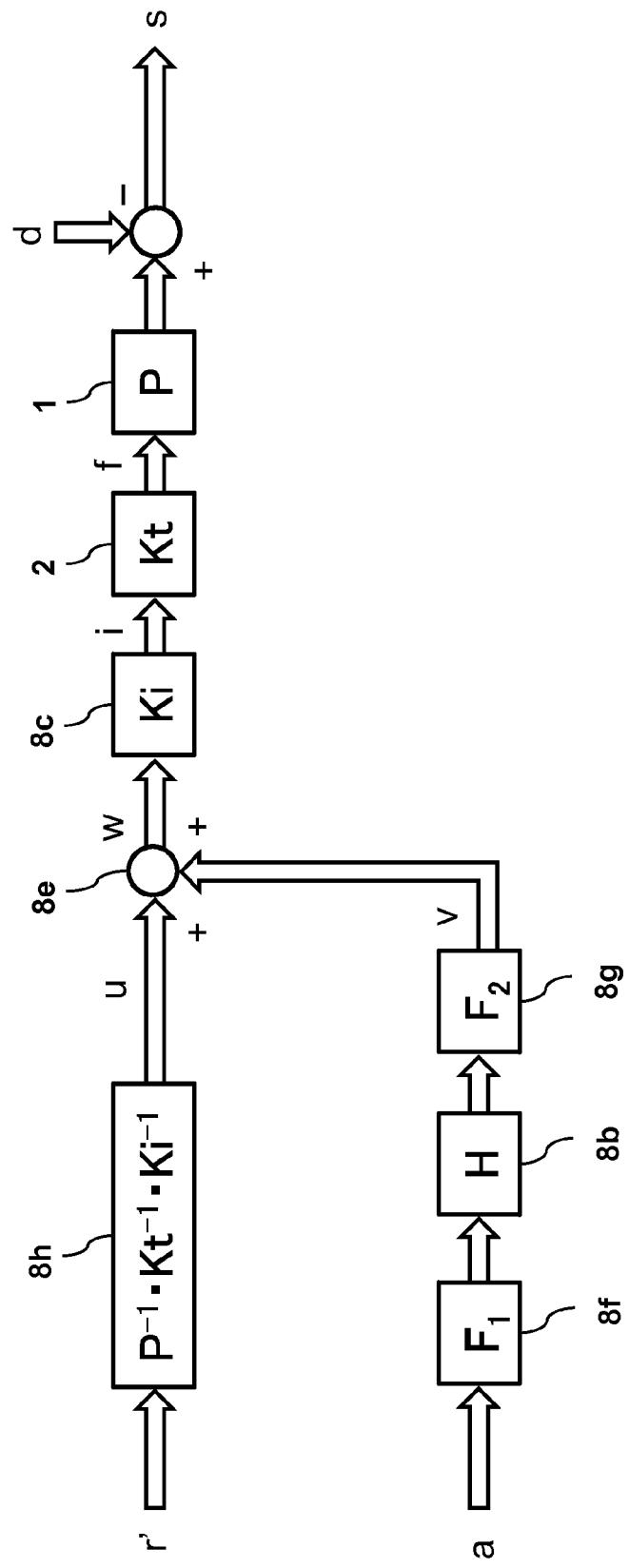
FIG. 6 is a block diagram of a control system in an optical apparatus according to a third embodiment.

FIG. 6 is a block diagram of the control system of the optical apparatus according to the third embodiment. The target shape r' of the mirror is represented by a matrix of the target amounts of displacement at locations in the mirror 1, and is supplied to a compensator 8*h* included in the control unit 8. The compensator 8*h* has a transfer function that receives an input of the target shape r' of the mirror 1 and outputs a command value u for controlling each actuator 2. The transfer function of the compensator 8*h* is obtained by multiplying inverse characteristics of the current gain Ki of the driver 8*c*, inverse characteristic of the thrust constant Kt of each actuator 2 and inverse characteristics of the transfer function P of the mirror 1, and can be represented by "$P^{-1} \cdot Kt^{-1} \cdot Ki^{-1}$". The inverse characteristics of the transfer function P of the mirror 1 may be determined through calculation using analysis with a finite element model or simulation, or may be determined by using the optical apparatus (real machine. Also, the feed-forward control system that controls each actuator 2 based on the result (acceleration a) of detection performed by the detection unit 6 is the same as the optical apparatus 10 according to the first embodiment. By configuring the control system as described above, the measuring unit 4 that measures the shape of the mirror 1 becomes unnecessary, and thus cost reduction of the apparatus can be achieved. In this case, for example, the transfer function H of the compensator 8*b* may be determined by, for example, determining the transfer function U and the transfer function G through calculation or simulation using an external computer provided outside the optical apparatus 10 or the exposure apparatus.

Embodiment of Exposure Apparatus

An exposure apparatus according to an embodiment of the present invention will be described with reference to FIG. 7. An exposure apparatus 50 according to the present embodiment may include an illumination optical system IL, a projection optical system PO, a movable mask stage MS configured to hold a mask 55, and a movable substrate stage WS configured to hold a substrate 56. The exposure apparatus 50 may also include a control unit 51 that controls processing for exposing the substrate 56 with light.

Light emitted from a light source (not shown) included in the illumination optical system IL can form, on the mask 55, an arc-shaped illuminated region that is elongated in, for example, the Y direction through a slit (not shown) included in the illumination optical system IL. The mask 55 and the substrate 56 are held by the mask stage MS and the substrate stage WS, respectively, and are disposed at optically substantially conjugate positions (the positions corresponding to the object plane and the imaging plane of the projection optical system PO) across the projection optical system PO. The projection optical system PO has a predetermined projection magnification (for example, ½), and projects a pattern formed on the mask 55 onto the substrate 56. Then, the mask stage MS and the substrate stage WS are scanned in a direction (for example, the X direction in FIG. 7) parallel to the object plane of the projection optical system PO at a velocity ratio corresponding to the projection magnification of the projection optical system PO. By doing so, the pattern formed on the mask 55 can be transferred onto the substrate 56.

Figure 7:
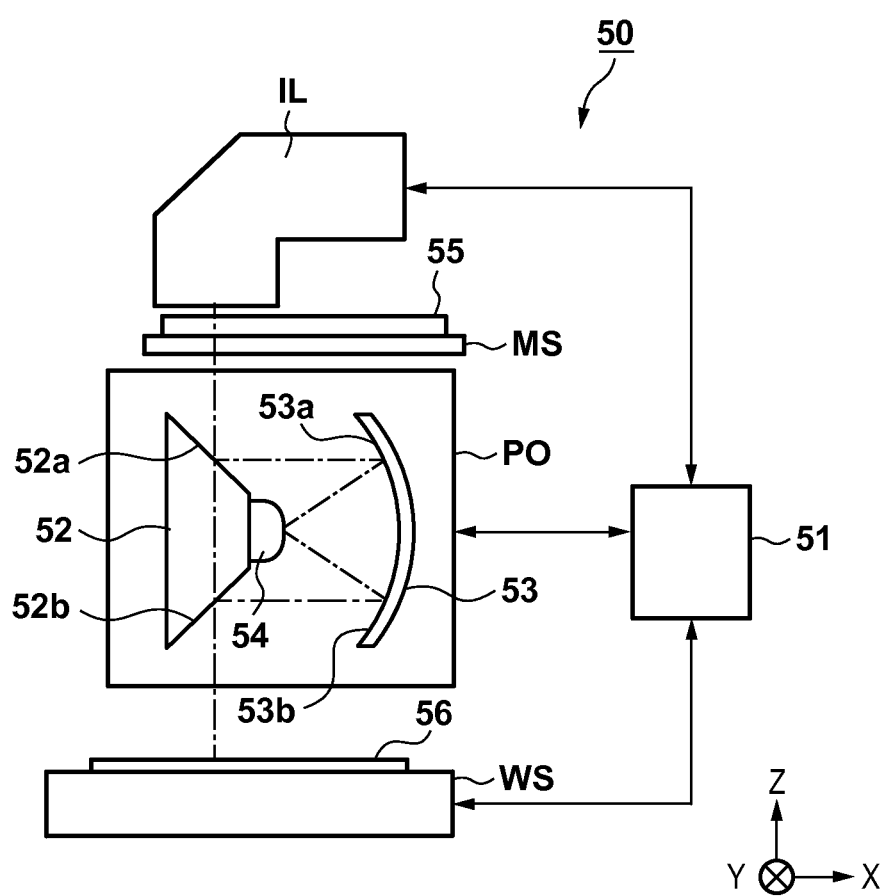
FIG. 7 is a schematic diagram showing an example of a configuration of an exposure apparatus.

The projection optical system PO includes, for example, as shown in FIG. 7, a plane mirror 52, a concave mirror 53 and a convex mirror 54. The optical path of exposure light that has been emitted from the illumination optical system IL and has passed through the mask 55 is bent by a first surface 52*a* of the plane mirror 52, and is incident on a first surface 53*a* of the concave mirror 53. The exposure light reflected by the first surface 53*a* of the concave mirror 53 is reflected by the convex mirror 54, and is incident on a second surface 53*b* of the concave mirror 53. The optical path of exposure light reflected by the second surface 53*b* of the concave mirror 53 is bent by a second surface 52*b* of the plane mirror 52, and forms an image on the substrate. In the projection optical system PO configured as described above, the surface of the convex mirror 54 serves as an optical pupil.

In the configuration of the exposure apparatus 50 described above, the optical apparatus of the above-described embodiment can be used as, for example, an apparatus that deforms the reflecting surface of the concave mirror 53 serving as the mirror 1. By using the optical apparatus of the above-described embodiment in the exposure apparatus 50, the reflecting surface (the first surface 53*a* and the second surface 53*b*) of the concave mirror 53 can be deformed at a high speed and with high accuracy, and the optical aberration in the projection optical system PO can be corrected in real time and with high accuracy. The control unit 51 in the exposure apparatus 50 may include the control unit 8 for controlling the actuators 2 in the optical apparatus according to the above-described embodiment. In the case where the optical apparatus according to the above-described embodiment is used as an apparatus that deforms the reflecting surface of the concave mirror 53, the X direction, the Y direction and the Z direction in FIG. 7 respectively correspond to the −Z direction, the Y direction and the X direction in FIGS. 1 and 5.

Embodiment of Method for Manufacturing Article

A method of manufacturing an article according to an embodiment of the present invention is suitable to manufacture, for example, an article such as a micro device such as a semiconductor device or an element having a microstructure. The method of manufacturing an article of the present embodiment includes a step of forming a latent image pattern on a substrate on which a photosensitizing agent applied by using the above-described exposure apparatus (step of exposing a substrate with light) and a step of developing the substrate on which the latent image pattern has been formed in the above step. The manufacturing method further includes other known steps (oxidation, film-forming, vapor deposition, doping, planarization, etching, photoresist stripping, dicing, bonding, packaging, and the like). The method of manufacturing an article according to the present embodiment is advantageous in terms of at least one of the performance, quality, productivity and production cost of the article as compared to conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-095510 filed on May 2, 2014, which is hereby incorporated by reference herein in its entirety.

What is claimed is:

1. An optical apparatus that deforms a mirror, the optical apparatus comprising:
   a base plate configured to support the mirror;
   a plurality of actuators that are disposed between the base plate and the mirror and are configured to apply a force to the mirror;
   a detection unit configured to detect vibration of the base plate; and
   a control unit configured to perform feed-forward control of each actuator based on a result of detection performed by the detection unit such that a deformation of the mirror caused as a result of the vibration of the base plate is within an acceptable range.

2. The optical apparatus according to claim 1,
   wherein the control unit includes a compensator configured to determine a command value for controlling each actuator based on the result of detection performed by the detection unit, and
   wherein the compensator includes a transfer function determined by multiplying an inverse of a first transfer function by a second transfer function, the first transfer function receiving an input of the command value and outputting a deformation of the mirror, and the second transfer function receiving an input of the vibration of the base plate and outputting a deformation of the mirror.

3. The optical apparatus according to claim 2,
wherein the first transfer function is determined by obtaining, for each actuator, an amount of displacement by which each of a plurality of locations in the mirror is displaced in a case where one actuator applies a unit amount of force to the mirror.

4. The optical apparatus according to claim 3, further comprising a measuring unit that is provided to the base plate and is configured to measure positions at locations in the mirror,
wherein amounts of displacement at the locations in the mirror are obtained based on a result of measurement performed by the measuring unit.

5. The optical apparatus according to claim 3, further comprising:
a reference object; and
a measuring unit that is provided to the reference object and is configured to measure positions at locations in the mirror,
wherein amounts of displacement at the locations in the mirror are obtained based on a result of measurement performed by the measuring unit.

6. The optical apparatus according to claim 5,
wherein the detection unit is provided to the reference object and detects an acceleration of the reference object as vibration of the base plate.

7. The optical apparatus according to claim 2, further comprising a vibration unit configured to apply vibration to the base plate,
wherein the second transfer function is determined by obtaining amounts of displacement at each of a plurality of locations in the mirror in a case where the vibration is applied to the base plate by the vibration unit.

8. The optical apparatus according to claim 7, further comprising a measuring unit that is provided to the base plate and is configured to measure positions at locations in the mirror,
wherein amounts of displacement at the locations in the mirror are obtained based on a result of measurement performed by the measuring unit.

9. The optical apparatus according to claim 1,
wherein the detection unit is provided to the base plate and detects an acceleration of the base plate as vibration of the base plate.

10. The optical apparatus according to claim 9, wherein the acceleration of the base plate is obtained by performing a differential operation on a velocity of the base plate.

11. The optical apparatus according to claim 1,
wherein the control unit includes a compensator configured to determine a command value for controlling each actuator based on an error between a shape of the mirror and a target shape.

12. The optical apparatus according to claim 1, further comprising a fixing member configured to fix a part of the mirror including a center of the mirror to the base plate.

13. The optical apparatus according to claim 1, wherein the control unit is configured to perform the feed-forward control of each actuator such that a phase delay of vibration to be transmitted from the base plate to the mirror is compensated.

14. The optical apparatus according to claim 1, wherein each of the plurality of actuators is connected to the mirror.

15. The optical apparatus according to claim 1, wherein the control unit is configured to perform feed-forward control of each actuator based on the result of detection performed by the detection unit such that a deformation of the mirror caused by vibration to be transmitted from the base plate to the mirror is compensated.

16. A projection optical system that projects a mask pattern onto a substrate, the projection optical system comprising an optical apparatus that deforms a mirror,
wherein the optical apparatus includes:
a base plate configured to support the mirror;
a plurality of actuators that are disposed between the base plate and the mirror and are configured to apply a force to the mirror;
a detection unit configured to detect vibration of the base plate; and
a control unit configured to perform feed-forward control of each actuator based on a result of detection performed by the detection unit such that a deformation of the mirror caused as a result of the vibration of the base plate is within an acceptable range.

17. An exposure apparatus that exposes a substrate with light, the exposure apparatus comprising a projection optical system that includes an optical apparatus and projects a mask pattern onto a substrate,
wherein the optical apparatus deforms a mirror, and includes:
a base plate configured to support the mirror;
a plurality of actuators that are disposed between the base plate and the mirror and are configured to apply a force to the mirror;
a detection unit configured to detect vibration of the base plate; and
a control unit configured to perform feed-forward control of each actuator based on a result of detection performed by the detection unit such that a deformation of the mirror caused as a result of the vibration of the base plate is within an acceptable range.

18. A method of manufacturing an article, the method comprising steps of:
exposing a substrate using an exposure apparatus;
developing the exposed substrate; and
processing the developed substrate to manufacture the article,
wherein the exposure apparatus exposes the substrate and includes a projection optical system, which projects a mask pattern onto the substrate and includes an optical apparatus, and
wherein the optical apparatus deforms a mirror, and includes:
a base plate configured to support the mirror;
a plurality of actuators that are disposed between the base plate and the mirror and are configured to apply a force to the mirror;
a detection unit configured to detect vibration of the base plate; and
a control unit configured to perform feed-forward control of each actuator based on a result of detection performed by the detection unit such that a deformation of the mirror caused as a result of the vibration of the base plate is within an acceptable range.

19. An optical apparatus that deforms a reflecting surface of a mirror, the optical apparatus comprising:
a base plate;
a plurality of actuators that are disposed between the base plate and the mirror and are configured to apply a force to the mirror;
a detection unit configured to detect vibration generated in the base plate; and
a control unit configured to control each actuator based on a result of detection performed by the detection unit such that a deformation of the mirror caused as a result of the vibration generated in the base plate is within an acceptable range,
wherein the control unit includes a compensator configured to determine a command value for controlling each actuator based on the result of detection performed by the detection unit, and
wherein the control unit determines a transfer function of the compensator by multiplying an inverse of a first transfer function by a second transfer function, the first transfer function receiving an input of the command value and outputting a deformation of the mirror, and the second transfer function receiving an input of the vibration of the base plate and outputting a deformation of the mirror.

20. A projection optical system that projects a mask pattern onto a substrate, the projection optical system comprising an optical apparatus that deforms a reflecting surface of a mirror,
wherein the optical apparatus includes:
a base plate;
a plurality of actuators that are disposed between the base plate and the mirror and are configured to apply a force to the mirror;
a detection unit configured to detect vibration generated in the base plate; and
a control unit configured to control each actuator based on a result of detection performed by the detection unit such that a deformation of the mirror caused as a result of the vibration generated in the base plate is within an acceptable range,
wherein the control unit includes a compensator configured to determine a command value for controlling each actuator based on the result of detection performed by the detection unit, and
wherein the control unit determines a transfer function of the compensator by multiplying an inverse of a first transfer function by a second transfer function, the first transfer function receiving an input of the command value and outputting a deformation of the mirror, and the second transfer function receiving an input of the vibration of the base plate and outputting a deformation of the mirror.

21. An exposure apparatus that exposes a substrate with light, the exposure apparatus comprising a projection optical system that includes an optical apparatus and projects a mask pattern onto a substrate,
wherein the optical apparatus deforms a reflecting surface of a mirror, and includes:
a base plate;
a plurality of actuators that are disposed between the base plate and the mirror and are configured to apply a force to the mirror;
a detection unit configured to detect vibration generated in the base plate; and
a control unit configured to control each actuator based on a result of detection performed by the detection unit such that a deformation of the mirror caused as a result of the vibration generated in the base plate is within an acceptable range,
wherein the control unit includes a compensator configured to determine a command value for controlling each actuator based on the result of detection performed by the detection unit, and
wherein the control unit determines a transfer function of the compensator by multiplying an inverse of a first transfer function by a second transfer function, the first transfer function receiving an input of the command value and outputting a deformation of the mirror, and the second transfer function receiving an input of the vibration of the base plate and outputting a deformation of the mirror.

22. A method of manufacturing an article, the method comprising steps of:
exposing a substrate using an exposure apparatus;
developing the exposed substrate; and
processing the developed substrate to manufacture the article,
wherein the exposure apparatus exposes the substrate and includes a projection optical system, which projects a mask pattern onto the substrate and includes an optical apparatus, and
wherein the optical apparatus deforms a reflecting surface of a mirror, and includes:
a base plate;
a plurality of actuators that are disposed between the base plate and the mirror and are configured to apply a force to the mirror;
a detection unit configured to detect vibration generated in the base plate; and
a control unit configured to control each actuator based on a result of detection performed by the detection unit such that a deformation of the mirror caused as a result of the vibration generated in the base plate is within an acceptable range,
wherein the control unit includes a compensator configured to determine a command value for controlling each actuator based on the result of detection performed by the detection unit, and
wherein the control unit determines a transfer function of the compensator by multiplying an inverse of a first transfer function by a second transfer function, the first transfer function receiving an input of the command value and outputting a deformation of the mirror, and the second transfer function receiving an input of the vibration of the base plate and outputting a deformation of the mirror.

23. An optical apparatus that deforms a reflecting surface of a mirror, the optical apparatus comprising:
a base plate;
a plurality of actuators that are disposed between the base plate and the mirror and are configured to apply a force to the mirror;
a detection unit configured to detect vibration generated in the base plate; and
a control unit configured to control each actuator based on a result of detection performed by the detection unit such that a deformation of the mirror caused as a result of the vibration generated in the base plate is within an acceptable range,
wherein the detection unit detects an acceleration of the base plate as the vibration generated in the base plate.

24. A projection optical system that projects a mask pattern onto a substrate, the projection optical system comprising an optical apparatus that deforms a reflecting surface of a mirror,
  wherein the optical apparatus includes:
    a base plate;
    a plurality of actuators that are disposed between the base plate and the mirror and are configured to apply a force to the mirror;
    a detection unit configured to detect vibration generated in the base plate; and
    a control unit configured to control each actuator based on a result of detection performed by the detection unit such that a deformation of the mirror caused as a result of the vibration generated in the base plate is within an acceptable range,
    wherein the detection unit detects an acceleration of the base plate as the vibration generated in the base plate.

25. An exposure apparatus that exposes a substrate with light, the exposure apparatus comprising a projection optical system that includes an optical apparatus and projects a mask pattern onto a substrate,
  wherein the optical apparatus deforms a reflecting surface of a mirror, and includes:
    a base plate;
    a plurality of actuators that are disposed between the base plate and the mirror and are configured to apply a force to the mirror;
    a detection unit configured to detect vibration generated in the base plate; and
    a control unit configured to control each actuator based on a result of detection performed by the detection unit such that a deformation of the mirror caused as a result of the vibration generated in the base plate is within an acceptable range,
    wherein the detection unit detects an acceleration of the base plate as the vibration generated in the base plate.

26. A method of manufacturing an article, the method comprising steps of:
  exposing a substrate using an exposure apparatus;
  developing the exposed substrate; and
  processing the developed substrate to manufacture the article,
  wherein the exposure apparatus exposes the substrate and includes a projection optical system, which projects a mask pattern onto the substrate and includes an optical apparatus, and
  wherein the optical apparatus deforms a reflecting surface of a mirror, and includes:
    a base plate;
    a plurality of actuators that are disposed between the base plate and the mirror and are configured to apply a force to the mirror;
    a detection unit configured to detect vibration generated in the base plate; and
    a control unit configured to control each actuator based on a result of detection performed by the detection unit such that a deformation of the mirror caused as a result of the vibration generated in the base plate is within an acceptable range,
    wherein the detection unit detects an acceleration of the base plate as the vibration generated in the base plate.

27. An optical apparatus that deforms a reflecting surface of a mirror, the optical apparatus comprising:
  a base plate;
  a plurality of actuators that are disposed between the base plate and the mirror and are configured to apply a force to the mirror;
  a detection unit configured to detect vibration generated in the base plate; and
  a control unit configured to control each actuator based on a result of detection performed by the detection unit such that a deformation of the mirror caused as a result of the vibration generated in the base plate is within an acceptable range,
  wherein the control unit includes a compensator configured to determine a command value for controlling each actuator based on an error between a shape of the mirror and a target shape.

28. A projection optical system that projects a mask pattern onto a substrate, the projection optical system comprising an optical apparatus that deforms a reflecting surface of a mirror,
  wherein the optical apparatus includes:
    a base plate;
    a plurality of actuators that are disposed between the base plate and the mirror and are configured to apply a force to the mirror;
    a detection unit configured to detect vibration generated in the base plate; and
    a control unit configured to control each actuator based on a result of detection performed by the detection unit such that a deformation of the mirror caused as a result of the vibration generated in the base plate is within an acceptable range,
    wherein the control unit includes a compensator configured to determine a command value for controlling each actuator based on an error between a shape of the mirror and a target shape.

29. An exposure apparatus that exposes a substrate with light, the exposure apparatus comprising a projection optical system that includes an optical apparatus and projects a mask pattern onto a substrate,
  wherein the optical apparatus deforms a reflecting surface of a mirror, and includes:
    a base plate;
    a plurality of actuators that are disposed between the base plate and the mirror and are configured to apply a force to the mirror;
    a detection unit configured to detect vibration generated in the base plate; and
    a control unit configured to control each actuator based on a result of detection performed by the detection unit such that a deformation of the mirror caused as a result of the vibration generated in the base plate is within an acceptable range,
    wherein the control unit includes a compensator configured to determine a command value for controlling each actuator based on an error between a shape of the mirror and a target shape.

30. A method of manufacturing an article, the method comprising steps of:
  exposing a substrate using an exposure apparatus;
  developing the exposed substrate; and
  processing the developed substrate to manufacture the article,
  wherein the exposure apparatus exposes the substrate and includes a projection optical system, which projects a mask pattern onto the substrate and includes an optical apparatus, and wherein the optical apparatus deforms a reflecting surface of a mirror, and includes:
a base plate;
a plurality of actuators that are disposed between the base plate and the mirror and are configured to apply a force to the mirror;
a detection unit configured to detect vibration generated in the base plate; and
a control unit configured to control each actuator based on a result of detection performed by the detection unit such that a deformation of the mirror caused as a result of the vibration generated in the base plate is within an acceptable range,
wherein the control unit includes a compensator configured to determine a command value for controlling each actuator based on an error between a shape of the mirror and a target shape.

31. An optical apparatus that deforms a reflecting surface of a mirror, the optical apparatus comprising:
a base plate;
a plurality of actuators that are disposed between the base plate and the mirror and are configured to apply a force to the mirror;
a detection unit configured to detect vibration generated in the base plate;
a control unit configured to control each actuator based on a result of detection performed by the detection unit such that a deformation of the mirror caused as a result of the vibration generated in the base plate is within an acceptable range; and
a fixing member configured to fix a part of the mirror including a center of the mirror to the base plate.

32. A projection optical system that projects a mask pattern onto a substrate, the projection optical system comprising an optical apparatus that deforms a reflecting surface of a mirror,
wherein the optical apparatus includes:
a base plate;
a plurality of actuators that are disposed between the base plate and the mirror and are configured to apply a force to the mirror;
a detection unit configured to detect vibration generated in the base plate;
a control unit configured to control each actuator based on a result of detection performed by the detection unit such that a deformation of the mirror caused as a result of the vibration generated in the base plate is within an acceptable range; and
a fixing member configured to fix a part of the mirror including a center of the mirror to the base plate.

33. An exposure apparatus that exposes a substrate with light, the exposure apparatus comprising a projection optical system that includes an optical apparatus and projects a mask pattern onto a substrate,
wherein the optical apparatus deforms a reflecting surface of a mirror, and includes:
a base plate;
a plurality of actuators that are disposed between the base plate and the mirror and are configured to apply a force to the mirror;
a detection unit configured to detect vibration generated in the base plate;
a control unit configured to control each actuator based on a result of detection performed by the detection unit such that a deformation of the mirror caused as a result of the vibration generated in the base plate is within an acceptable range; and
a fixing member configured to fix a part of the mirror including a center of the mirror to the base plate.

34. A method of manufacturing an article, the method comprising steps of:
exposing a substrate using an exposure apparatus;
developing the exposed substrate; and
processing the developed substrate to manufacture the article,
wherein the exposure apparatus exposes the substrate and includes a projection optical system, which projects a mask pattern onto the substrate and includes an optical apparatus, and
wherein the optical apparatus deforms a reflecting surface of a mirror, and includes:
a base plate;
a plurality of actuators that are disposed between the base plate and the mirror and are configured to apply a force to the mirror;
a detection unit configured to detect vibration generated in the base plate; and
a control unit configured to control each actuator based on a result of detection performed by the detection unit such that a deformation of the mirror caused as a result of the vibration generated in the base plate is within an acceptable range; and
a fixing member configured to fix a part of the mirror including a center of the mirror to the base plate.

* * * * *